United States Patent
Tomoi et al.

(10) Patent No.: US 7,638,255 B2
(45) Date of Patent: Dec. 29, 2009

(54) METHOD FOR FORMING IMAGE THROUGH REACTION DEVELOPMENT

(75) Inventors: Masao Tomoi, Kanagawa (JP); Takafumi Fukushima, Kanagawa (JP); Hiroshi Itatani, Kanagawa (JP)

(73) Assignee: Yokohama TLO Company, Ltd., Kanagawa (JP)

(*) Notice: Subject to any disclaimer, the term of this patent is extended or adjusted under 35 U.S.C. 154(b) by 722 days.

(21) Appl. No.: 10/491,771

(22) PCT Filed: Oct. 4, 2002

(86) PCT No.: PCT/JP02/10396

§ 371 (c)(1),
(2), (4) Date: Apr. 2, 2004

(87) PCT Pub. No.: WO03/032091

PCT Pub. Date: Apr. 17, 2003

(65) Prior Publication Data

US 2004/0241591 A1 Dec. 2, 2004

(30) Foreign Application Priority Data

Oct. 5, 2001 (JP) ............................. 2001-309500

(51) Int. Cl.
*G03F 7/00* (2006.01)
*G03F 7/004* (2006.01)

(52) U.S. Cl. .................... 430/270.1; 430/331; 430/913; 430/311

(58) Field of Classification Search ............... 430/270.1, 430/913, 331
See application file for complete search history.

(56) References Cited

U.S. PATENT DOCUMENTS

| 4,002,593 | A | * | 1/1977 | Jones | ........................ 523/318 |
| 4,948,700 | A | * | 8/1990 | Maeda et al. | ............ 430/280.1 |
| 5,338,643 | A | * | 8/1994 | Kanazawa et al. | .......... 430/190 |
| 5,473,450 | A | * | 12/1995 | Yamada et al. | ................ 349/84 |
| 6,190,841 | B1 | | 2/2001 | Kihara et al. | |
| 6,359,081 | B1 | * | 3/2002 | Shimada et al. | ............. 525/468 |

(Continued)

FOREIGN PATENT DOCUMENTS

JP        6-340802  A    12/1994

(Continued)

OTHER PUBLICATIONS

English lagnuage translation of JP 06-340802.*

(Continued)

*Primary Examiner*—Amanda C. Walke
(74) *Attorney, Agent, or Firm*—Gary C Cohn PLLC

(57) ABSTRACT

The invention relates to a reaction development patterning process wherein a photo resist layer masked by a desired pattern is irradiated using ultraviolet light and this layer is subsequently washed using a solvent solution containing alkali characterized by said photo resist layer comprising a condensation type polymer containing in the main chain carbonyl groups (C=O) bonded to hetero atoms and a photo acid generating agent and said alkali being an amine. This reaction development patterning process is characterized by being able to use as a photo resist target resins containing bonds having low reactivity toward nucleophilic reagents, for example, condensation type polymers containing any one of bonds such as carbonate, ester, urethane and amide.

9 Claims, 2 Drawing Sheets

U.S. PATENT DOCUMENTS 6,586,154 B1    7/2003    Choi et al.
6,730,771 B2 *    5/2004    Van Benthem et al. ...... 528/335

FOREIGN PATENT DOCUMENTS

JP          11-202488 A    7/1999

OTHER PUBLICATIONS

English language translation of JP 11-202488.*

Masao Tomoi et al, Lithographic Properties of Positive Type Photosensitive Block Copolymer Polyimide, Nov. 29, 2000.

* cited by examiner

METHOD FOR FORMING IMAGE THROUGH REACTION DEVELOPMENT

TECHNICAL FIELD OF THE INVENTION

This invention relates to a photo resist technology that can be used to manufacture semiconductor integrated circuits, printed wire substrates and liquid crystal panels, more specifically, to a photo resist technology to form a positive image with a reactive alkali development solution by making a film with a condensation type polymer and a photo acid generating agent and irradiating ultraviolet light.

PRIOR ART

Photo resist technology is usually, in a technology field related to photographic plate processing, applied to organic polymers capable of photo molding that are used to manufacture printed electronic circuits and printed circuit substrates or to manufacture semiconductor laminates with microelectronic engineering.

In order to create a circuit structure when manufacturing semiconductor integrated parts using microelectronic engineering, a semiconductor substrate generates a photo resist relief structure, by exposing a photo resist layer, covered with a photo resist, to light to form an image, and subsequently developing it. This relief structure is used as a mask over a semiconductor substrate to create actual circuit patterns in conjunction with etching doping using a metal, other semiconductors or an insulated base. The photo resist mask is usually removed subsequently. A microchip relief structure is formed on a substrate using such multiple processing cycles.

Two different photo resist types, positive resists and negative resists, are available. The difference between the two is explained here. The exposed area of a positive type photo resist is removed by a development process, and the non-exposed area remains as a layer over the base material. A negative type photo resist, however, leaves the irradiated area as a relief structure. Positive type photo resists basically have higher image resolution and are used to manufacture VLSI (very large scale integrated circuits).

An ordinary positive type photo resist basically contains, in an organic solvent solution, at least one type of novolak resin that is soluble in an aqueous alkali and a photosensitive quinone diazide compound capable of lowering the degree of solubility for said resin in alkali. By irradiating a photo resist layer formed using said composition, the degree of alkali solubility of the exposed area increases due to a light induced structural change of the quinone diazide to the carboxylic acid derivative. A positive type photo resist relief structure can be obtained upon executing a development process in an aqueous alkali development solution.

Since polyimides, commonly referred to as kapton, are slightly soluble in solvents, negative type images of polyimide have been obtained by using unstable polyamide acid precursors and irradiating the systems to which an acrylic acid type ester has been added.

The light energy induces latent chromophores in polymer resists to react, and property changes occur due to changes in polymer structure. Polymer resists contain various chromophores and are classified into categories depending upon the polymer structure changes induced by the light, such as photo crosslinking, photo polymerization, photo collapse and photo initiated polarity change.

Polymers having low molecular weight, in which disruptions of main polymer chains of polymers induced by photo irradiation occur randomly, are found. Polymers containing carbonyl groups decompose according to type 1 and type 2 Norrish reactions. The main polymer chains of this series are severed due to main chain carbonyl group excitation. Therefore, although the sensitivity needed for X ray, electron beam and short wavelength ultraviolet irradiation is low, they yield a very high degree of resolution and excellent profile. [M. Hatzaki, J. Electrochem. Soc., 116(7), p. 1033 (1969) and Semiconductor Integrated Circuit Resist Material Handbook, A. Yamaoka, editor, p. 46, Realize Inc. (1966)]

Problems Encountered

Conventional photo resists require either functional groups that can react with a base (for example, carboxyl groups and phenolic hydroxyl groups) or reactive groups that can generate carboxyl groups and phenolic hydroxyl groups by reacting with an acid or a base (an ester or a phenol type ether bonded to a protective group) on the polymer side chains. (For example, see Japanese Unexamined Patent Applications No. 2001-66781, No. 2001-192573 and No. 2001-249458.) That is, carboxyl groups, phenolic hydroxyl groups or groups obtained by bonding suitable protective groups to these groups need to be introduced to a polymer side chain, when a simple polycarbonate is used in a resist according to conventional means. However, the introduction of these functional groups is very difficult and there is no other practical significance to the functional group addition.

Therefore, a general purpose resin could not be used in a conventional photo resist for this reason, and applications were naturally limited.

The objective of the present invention is to present a means to directly attack these bonds and destroy the bonds using general purpose resins containing in its main chain carbonyl groups (C=O) bonded to a hetero atom, without having such special reacting groups in its side chain.

SUMMARY OF THE INVENTION

In order to solve these problems, the inventors developed an entirely new means referred to as a "reaction development patterning process". This process is one type of positive type photo resist technology, and a photo resist layer is first formed using a mixture comprising a general purpose resin containing in the main chain carbonyl groups (C=O) bonded to hetero atoms, described later, and a photo acid generating agent. Then the layer is masked using an appropriate, desired pattern and is irradiated using ultraviolet light. An acid is generated by the photo acid generating agent by the ultraviolet ray irradiation. A salt is formed by washing the layer with a development solution containing a nucleophilic amine to allow the nucleophilic amine to react with the acid formed, and the polarity of the exposed area is increased. As a result, the nucleophilic amine in the development solution attacks the carbonyl groups bonded to the hetero atoms constructing the polymer main chain in the exposed area. The attack breaks the main chain where said carbonyl groups are located. The breakage in the main chain results in low molecular weight polymers, which dissolve in the development solution.

In the "reaction development patterning process" of the present invention, condensation type polymers (such as polymers containing carbonyl groups bonded to hetero atoms in the main chain) without special functional groups described above and reactive groups in the side chain can be used as photo resist materials. In the conventional theory, this type of polymer could not be used in a resist.

That is, the present invention relates to a reaction development patterning process comprising the steps of irradiating a photo resist layer masked by a desired pattern using ultraviolet light and subsequently washing said layer using a solvent solution containing alkali, wherein said photo resist layer comprises a condensation type polymer containing in the main chain carbonyl groups (C=O) bonded to hetero atoms and a photo acid generating agent, and said alkali is an amine. The solvent solution containing alkali is preferably a mixture of an amine and at least one of water and organic solvents.

The aforementioned condensation type polymer does not need to contain, particularly in its side chain, functional groups capable of reacting with a base (for example, carboxyl groups and phenolic hydroxyl groups) or reactive groups capable of generating carboxyl groups or phenolic hydroxyl groups upon reacting with an acid or a base (esters and phenolic ethers bonded with protective groups).

In addition, the present invention includes a formed material (photo resist molded material) formed using the aforementioned reaction development patterning process and, furthermore, semiconductor integrated circuits, printed wire substrates, liquid crystal panels or photo wave guide path devices containing said formed material.

Here, ultraviolet light refer to electromagnetic waves centered on 250 nm to 450 nm and preferably centered on 300 nm to 400 nm.

The condensation type polymer containing carbonyl group (C=O) bonded to hetero atoms in the main chain refers to a polymer containing, in the main chain, imide bonds, carbonate bonds, ester bonds, urethane bonds or amide bonds or multiple numbers of these bonds.

That is, a condensation type polymer containing solely carbonyl groups bonded to hetero atoms in the main chain is suited as the polymer targeted by the present invention. For example, polyether imides, polyamides, polyamide imides, polycarbonates, poly(ethylene terephthalate), poly(butylene terephthalate), polyethylene 2,6-naphthalate, polyallylate, polyurethanes and copolymers associated thereof can be mentioned.

Here, the relative instability of such a bond when attacked by a nucleophilic amine in the reaction development patterning process of the present invention is shown in the table below.

TABLE 1

$$R-\underset{\text{Imide}}{C(=O)-N(R)-C(=O)-R} \; > \; R-\underset{\text{Carbonate}}{O-C(=O)-O-R} \; >$$

$$R-\underset{\text{Ester}}{C(=O)-O-R} \; \gtrsim \; R-\underset{\text{Urethane}}{O-C(=O)-N(H)-R} \; > \; R-\underset{\text{Amide}}{C(=O)-N(H)-R}$$

In this table, the groups become more susceptible (unstable) to nucleophilic attacks as you move to the left. According to this table, imide bonds are relatively unstable and are most readily attacked by an amine. That is, amines without any modification particularly can easily initiate a nucleophilic substitution reaction. However, carbonate, ester, urethane and amide bonds are relatively stable and are not susceptible to amine attack. That is, a nucleophilic substitution reaction is difficult to initiate unless the amine is modified to have powerful nucleophilicity. One feature of the reaction development patterning process of the present invention is that bonds highly stable to such nucleophilic reactions can be destroyed. That is, the reaction development patterning process of the present invention is characterized also by its ability to allow resins containing bonds with low reactivity toward nucleophilic reagents such as carbonates, esters, urethanes and amides to become photo resist targets.

In addition, the polymers to which the reaction development patterning process of the present invention can be applied preferentially do not need to contain, particularly in their side chains, functional groups capable of reacting with a base (for example, carboxyl groups and phenolic hydroxyl groups) or reactive groups that can generate carboxyl groups or phenolic hydroxyl groups upon reaction with an acid or base (an ester or a phenol type ether bonded with protective groups) and this is another feature.

Amines are compounds containing a nitrogen atom having an unshared electron pair and may be organic amines (includes amino acids) or inorganic amines. They are nucleophilic compounds and undergo nucleophilic reactions with carbonyl groups bonded to hetero atoms in a polymer in an exposed area having increased polarity caused by the acid generated by a photo acid generating agent.

Even amines considered not nucleophilic sometimes undergo a nucleophilic reaction with carbonyl groups under development conditions, particularly when a suitable solvent is selected. For example, tetramethylammonium hydroxide (TMAH) is not nucleophilic under ordinary conditions, and it can not be classified as a preferred amine in a reaction development patterning process of the present invention. However, the nucleophilicity of the OH anion of TMAH declines extensively in a system containing no water or only a small amount of water, such as an alcohol/N-methyl-2-pyrrolidone (henceforth, referred to as NMP), then the reactivity of the OH anion of TMAH toward carbonyl groups is thought to rise in a system containing an alcohol in place of water or does not even contain an alcohol, such as an organic solvent/NMP system.

Amine basicity increases with a rising acidity index (pKa), but the reactivity (nucleophilicity) toward a carbon atom in a carbonyl group (C=O) is more important than basicity in the reaction development patterning process of the present invention, and the reactivity is thought to increase with decreasing molecular size. Therefore, inorganic amines are generally more nucleophilic than organic amines containing large carbon chains bonded to a nitrogen atom and are suited to the reaction development patterning process of the present invention. Specific examples of nucleophilic amines of the present invention are listed in the table below along with their acid dissociation constants.

TABLE 2

|  | Acidity index p$K_a$ |
|---|---|
| Inorganic amines | |
| $NH_2OH$ (hydroxyl amine) | 6.0 |
| $NH_2NH_2$ (hydrazine) | 8.0 |
| $NH_3$ (amminia) | 9.25 |
| Organic amines | |
| $NH_2CH_2Ph$ (benzylamine) | 9.4 |
| $NH_2CH_2OH$ (ethanolamine) | 9.5 |
| $NH_2CH_2COOH$ (glycine) | 9.8 |
| $NH_2CH_2CH_2NH_2$ (ethylene diamine) | 9.9 |
| $NH_2CH_2CH_2COOH$ (β-alanine) | 10.3 |
| $NH_2CH_2CH_2CH_2CH_3$ (N-buthylamine) | 10.6 |

As preferred amines, listed in Table 2, the inorganic amines such as hydroxylamine, hydrazine and ammonia as well as organic amines such as N,N-dimethylethanolamine, N-methyl ethanolamine, ethanolamine, N-methyl morpholine, methylamine, ethylamine, N-propylamine, N-butylamine, benzylamine, cyclohexylamine, ethylene diamine and morpholine as well as amino acids such as glycine and β-alanine may be mentioned.

Inorganic amines have the advantage of not requiring an explosion proofed facility and having a low environmental load compared to organic amines.

In a process of the present invention, a combination of a polymer containing imide bonds, being most susceptible (low stability) to nucleophilic attack by nucleophilic amines, and a strongly nucleophilic inorganic amine can be referred to as the most preferred combination.

DETAILED DESCRIPTION OF THE INVENTION

Figure 1:
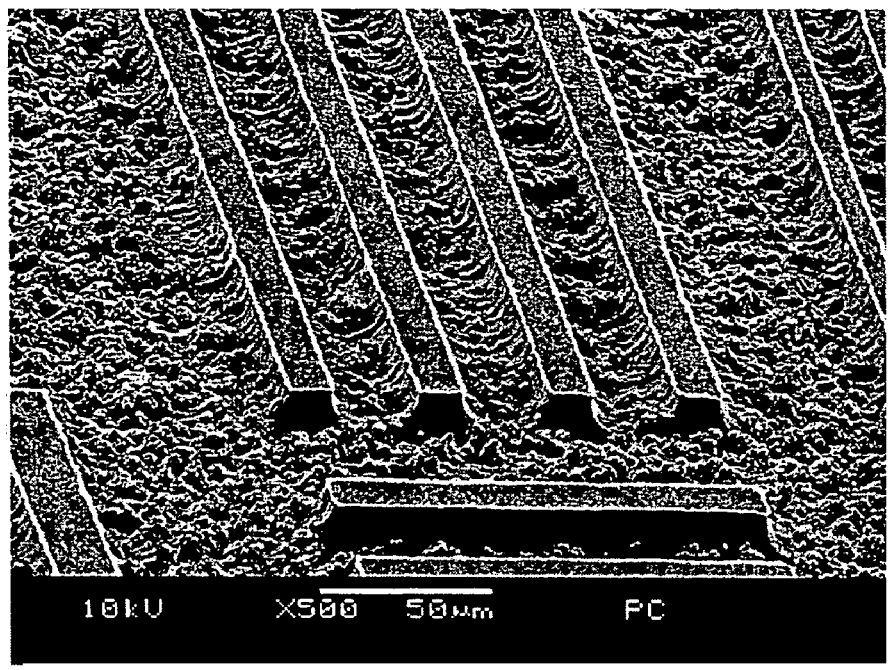
FIG. 1 shows an SEM photograph of a photo resist (Example 1) formed using PC on the resin and ethanolamine in the development solution.

A photo acid generating agent present in a positive type photo resist of the present invention is a compound that generates an acid upon irradiation with chemical radiation, and quinone diazide compounds, onium salts, sulfonate esters, halogenated organic compounds and the like are used. More specifically, quinone diazide compounds includes ester compounds of such as 1,2-naphthoquinone-2-diazide-5-sulfonic acid or 1,2-naphthoquinone-2-diazide-4-sulfonic acid with low molecular weight aromatic hydroquinone compounds, such as 2,3,4-trihydroxybenzophenone and 2,3,4,4'-tetrahydroxybenzophenone; trihydroxybenzenes such as 1,3,5-trihydroxybenzene, or cresol. Onium salts may be triphenyl sulfonium hexafluoroantimonate, triphenyl sulfonium hexafluorophosphate and the like. They are used along with an ester such as t-butyl benzoate. Of these, 1,2-naphthoquinone-2-diazide-5-sulfonic acid-p-cresol ester is particularly preferred.

A photo acid generating agent is used at 5% by weight to 50% by weight, preferably at 10% by weight to 40% by weight and more preferably at 20% by weight to 30% by weight based on the total solids content in a photo resist. Although data are not presented, these photo acid generating agents exhibit a dissolution inhibition effect in unexposed areas in that a resin film containing unreacted photo acid generating agent has a much slower dissolution rate in a development solution (an amine) than a resin film by itself without any photo acid generating agent present.

Solvents suitable for photo resist solutions as a rule are all solvents in which the non-volatile components of photo resists, for example, condensation polymers, photo acid generating agents and other desired additives are sufficiently soluble and that do not undergo an irreversible reaction with these components. Actual examples of the suitable solvents include non-protonic polar solvents such as N-methyl-2-pyrolidone, butyrolactone, cyclohexanone, diacetoxy ethylene glycol, sulfolane, tetramethyl urea, N,N'-dimethyl acetamide, dimethyl formamide, dimethyl sulfoxide, acetonitrile, diglyme, phenol, cresol, toluene and the like.

Other commonly used improving additives that may be present in a positive type photo resist of the present invention comprise coupling agents, uniform addition agents, plasticizers, other film forming resins, surfactants and stabilizers. These modification agents are familiar to those in the industry and are described in detail in related literature. The total amount of such modifying agents added does not exceed 25% by weight based on total solid concentration in a photo resist solvent.

A photo resist of the present invention is itself formulated by blending or dissolving the components in a solvent or a solvent mixture according to well known methods. The photo resist solution obtained by dissolving the components in a solvent is filtered through a filtration membrane containing fine pores of 0.1 µm to 1 µm.

The major applications of photo resists are in micro electronic engineering and in manufacturing of optoelectronic circuits and parts. In these applications, these materials function as, for example, insulation layers, protective layers, nonconductive layers, dielectric layers or orientation films in liquid crystal display elements when temporarily combined with photo resist masks and permanent structures. In addition, when clear materials such as polycarbonates and the like are used to form a light wave guide path, they can be used in optical wave guide devices.

A coating on a substrate is ordinarily applied using impregnation, spraying, roller application or spin coating. The thickness of the layer formed is dependent on the photo resist solution viscosity, solids content and spin coating rate. A photo resist of the present invention can form layers and relief structures having a layer thickness of 0.1 µm to 500 µm, preferably 1 µm to 100 µm. A thin layer in a multi-layer circuit may be 1 µm to 50 µm when combined temporarily with a photo resist or an insulation layer.

After applying a photo resist on a base material, the coating is commonly pre-dried at a temperature ranging from 50° C. to 120° C. An oven or a heating plate can be used. The drying time in an oven is five minutes to 60 minutes. The photo resist layer is subsequently irradiated. Chemical light beams are ordinarily used, but high energy radiation such as X ray and electron beams may also be used. Direct irradiation or irradiation through an exposure mask may be conducted. In addition, a radiation beam may also be aimed at a photo resist layer surface.

Ordinarily, the irradiation is executed using an ultraviolet lamp emitting central wavelengths from 250 nm to 450 nm or preferably 300 nm to 400 nm. Commercially available irradiation devices such as contact or non-contact exposure devices, scanning light projection type exposure devices and wafer steppers are preferred for the operation.

Upon exposure, the layer is treated with an alkaline developing solution that removes the irradiated areas from the photo resist to develop a pattern. For example, the exposed areas of a base material may be developed by impregnation or spraying.

A developing solution containing the aforementioned amine in water, an organic solvent or a mixture of water with an organic solvent is good. An organic solvent dissolves condensation type compounds, and a solvent capable of dissolving photo acid generating agents and various additives is used. As preferred examples, dimethyl formamide, N-methyl-2-pyrrolidone, dimethyl sulfoxide, tetramethyl urea, butyrolactone, diacetoxy ethylene glycol, cyclohexanone and the like may be used.

The molecular weight of a condensation type polymer does not change upon irradiation with chemical radiation in the presence of a photo acid generating agent. However, the irradiated area is decomposed upon subsequent impregnation in a developing solution and is dissolved by an alkaline solution to develop a pattern. This is the reactive development process mentioned in the title.

The reactive development process is dramatically different from the conventional development process which is based on a solubility change involving increased solubility in an alkaline solution upon acid addition. The development is executed while controlling the light exposure energy, the strength of the developing agent alkalinity, the development mode, the preliminary drying temperature, the developing temperature and the developing time.

The development is terminated ordinarily through impregnation or spraying of a non-solvent such as isopropanol, de-ionized water or a slightly acidic aqueous solution.

A positive type photo resist can yield a polymer coating having a layer thickness of 0.1 μm to 500 μm, preferably 1 μm to 100 μm, and a relief structure having sharp corners.

A post baking step varies according to the material type but can be executed in a range 150° C. to 350° C.

The present invention will be exemplified using examples the below, but the examples are not intended to limit the present invention.

In the examples, photo resists were formed according to the method shown below and were examined.

Photo resists were manufactured by filtering the photo resist formulations of individual examples using a three micron fine pore filtration membrane. This photo resist formulation was applied to a 10 cm in diameter copper foil surface (35 micron thick, Mitsui Kinzoku K. K. product) using a spin coating process. The coating was subsequently dried for ten minutes at 90° C. in an infrared hot air dryer. The photo resist film thickness was about 15 μm. A test pattern (10, 15, 20, 25, . . . , 200 μm through holes and line-and-base patterns) for a positive type photo mask was placed over this photo resist formulation coating film and was irradiated using a 2 kw super high pressure mercury lamp irradiation device (Oak Seisakusho product, JP-2000G) until an image was obtained (ultraviolet ray irradiation, 2,000 mJ/cm$^2$). The specified coating films following irradiation was impregnated for the specified durations of time in a developing solution, washed using de-ionized water, dried using an infrared lamp and the degree of resolution was examined. In several examples, the photo resists formed were captured using SEM (Nihon Denshi, scanning electron microscope JSM-5500LV, accelerating voltage: 10 kV).

Example 1

Twenty grams of bisphenol A type polycarbonate (henceforth referred to as PC) in the form of pellets was added to a 200 ml pear-shaped flask with 60 g of NMP. The contents were mechanically agitated at 180° C. to heat and dissolve the solids to obtain an NMP varnish of PC (the solids content: 25% by weight). Next, 20 g of the varnish was added to a solution obtained by dissolving 1.5 g of diazonaphthoquinone type photo sensitizer PC-5 (Toyo Gosei, 1,2-naphthoquinone-2-diazide-5-sulfonic acid p-cresol ester) in 5 g of NMP, and a photo resist formulation (a light sensitive PC composition) was prepared by agitating the mixture with a stirrer for about an hour at room temperature. This solution was spin coated (600 rpm/10 seconds+1,000 rpm/30 seconds) on a 35 μm electrolytic copper foil (on shiny or matte surface). The coating was pre-baked (90° C./10 minutes) using a far infrared hot air circulating type dryer to obtain a photosensitive PC coating film 15 μm thick. An ultraviolet ray exposure device (Oak Co.) was used, and the film was irradiated with light ranging from i-beam to g-beam through a PET photo mask. The exposure, metered using a luminance meter for use in i-beam region, was 1,000 mJ/cm$^2$. Following exposure, a development solution comprising 100 g of ethanolamine, 100 g of NMP and 100 g of ion exchanged water was used to develop the image for three minutes at 45° C. using an ultrasonic treatment or using an impregnation method. The film was rinsed for a minute using 100 g of ion exchanged water to obtain a positive image. The degree of resolution was 10 μm in terms of a line-and-space pattern. The SEM photograph of this photo resist is shown in FIG. 1.

Example 2

Polyarylate (Unitika, U polymer, henceforth referred to as PAr) was used in place of PC, but the same operations described in Example 1 were used to prepare a photo resist formulation.

Figure 2:
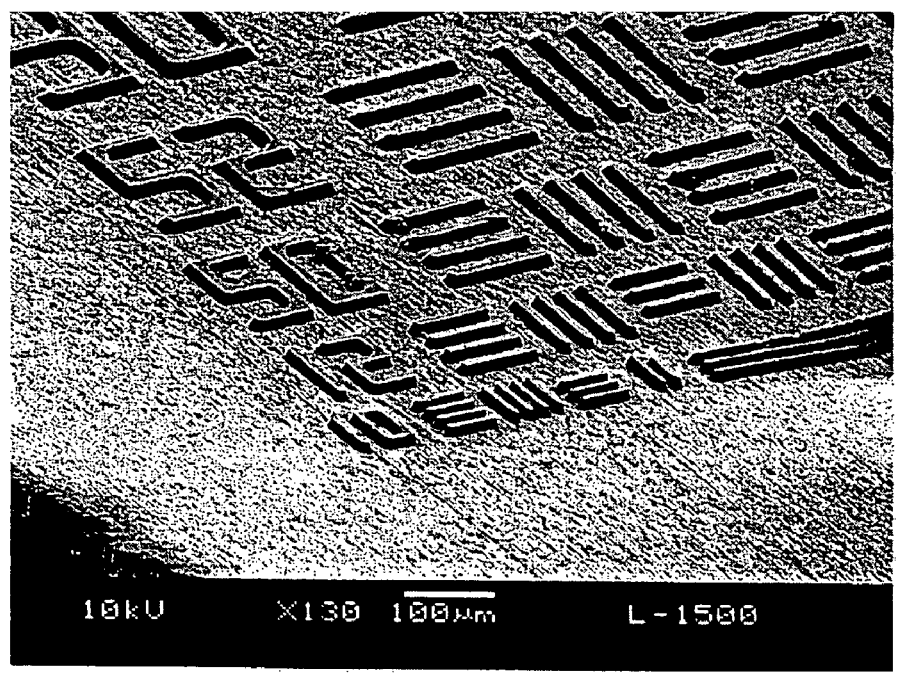
FIG. 2 shows SEM photograph of a photo resist (Example 2) formed using PAr on the resin and ethanolamine in the development solution.

This photo resist formulation was used to execute the same operations described in Example 1 to obtain a photosensitive coating film, 15 μm thick. Next, a developing solution comprising 400 g of ethanolamine, 100 g of NMP and 100 g of ion exchanged water was used, and the image was developed for twelve minutes at 45° C. The same operations described in Example 1 were conducted to obtain a positive image. The degree of resolution was 10 μm in terms of a line-and-space pattern. The SEM photograph of this photo resist is shown in FIG. 2.

Example 3

The same operations described in Example 1 were used to prepare a photo resist formulation (PC).

This photo resist formulation was used to execute the same operations described in Example 1 to obtain a photosensitive coating film 14 μm thick. An exposure rate of 2,000 mJ/cm$^2$ was used, and a developing solution comprising 100 g hydroxylamine, 100 g of NMP and 100 g of ion exchanged water was used to develop an image for seven minutes at 41° C. The same operations described in Example 1 were conducted to obtain a positive image. The degree of resolution was 20 μm in terms of a line-and-space pattern.

Example 4

The same operations described in Example 1 were used to prepare a photo resist formulation (PC).

This photo resist formulation was used to execute the same operations described in Example 1 to obtain a photosensitive coating film 14 μm thick. An exposure rate of 2,000 mJ/cm$^2$ was used, and a developing solution comprising 100 g hydrazine hydrate, 100 g of NMP and 100 g of ion exchanged water was used to develop an image for two minutes at 41° C. The same operations described in Example 1 were conducted to obtain a positive image. The degree of resolution was 20 μm in terms of a line-and-space pattern.

Example 5

The same operations described in Example 1 were used to prepare a photo resist formulation (PC).

Figure 3:
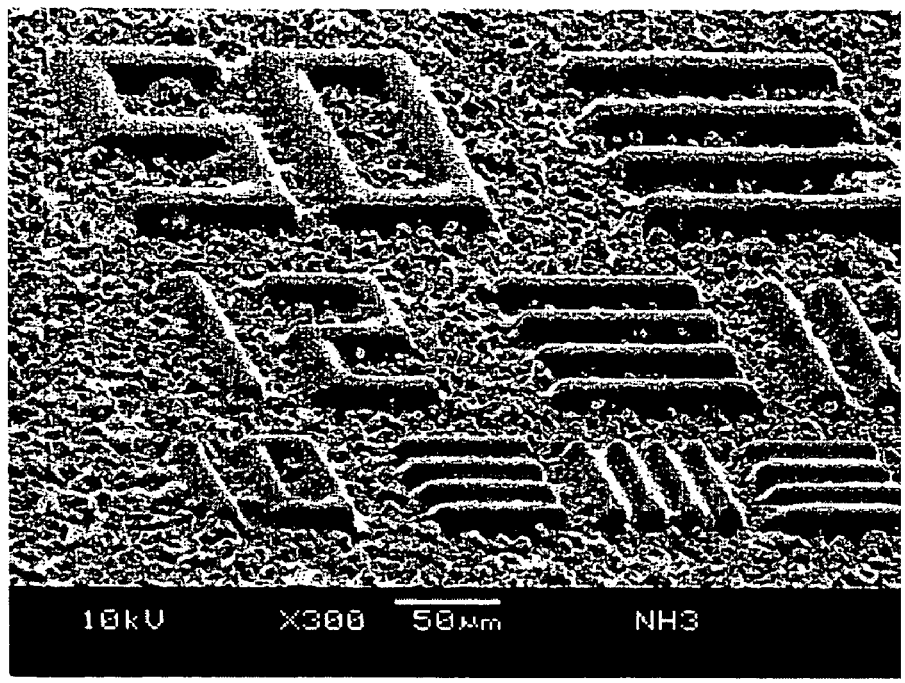
FIG. 3 shows SEM photograph of a photo resist (Example 5) formed using PC on the resin and 25% aqueous ammonia solution in the development solution.

This photo resist formulation was used to execute the same operations described in Example 1 to obtain a photosensitive coating film 14 μm thick. An exposure rate of 2,000 mJ/cm$^2$ was used, and a developing solution comprising 25% aqueous ammonia solution was used to develop an image for five minutes at 40° C. The same operations described in Example 1 were conducted to obtain a positive image. The degree of resolution was 10 μm in terms of line-and-space pattern. The SEM photograph of this photo resist is shown in FIG. 3.

Example 6

The same operations described in Example 1 were used to prepare a photo resist formulation using polyether imide (GE, Ultem, henceforth referred to as PEI) in place of PC.

This photo resist formulation was used to execute the same operations described in Example 1 to obtain a photosensitive coating film 15 μm thick. An exposure rate of 2,000 mJ/cm$^2$ was used, and a developing solution comprising 100 g hydroxylamine, 100 g of NMP and 100 g of ion exchanged water was used to develop an image for 20 minutes at 41° C. to 43° C. The same operations described in Example 1 were conducted to obtain a positive image. The degree of resolution was 20 μm in terms of line-and-space pattern.

Example 7

The same operations described in Example 1 were used to prepare a photo resist formulation using PEI in place of PC.

Figure 4:
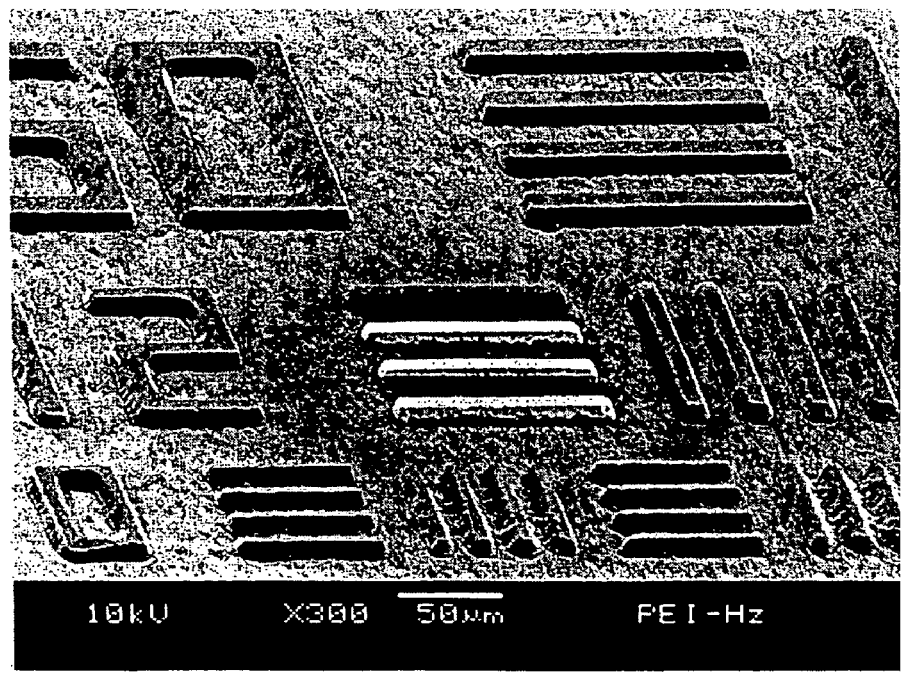
FIG. 4 shows SEM photograph of a photo resist (Example 7) formed using PEI on the resin and hydrazine hydrate in the development solution.

This photo resist formulation was used to execute the same operations described in Example 1 to obtain a photosensitive coating film 15 μm thick. An exposure rate of 2,000 mJ/cm$^2$ was used, and a developing solution comprising 100 g hydrazine hydrate, 100 g of NMP and 100 g of ion exchanged water was used to develop an image for 25 minutes at 41° C. to 43° C. The same operations described in Example 1 were conducted to obtain a positive image. The degree of resolution was 10 μm in terms of line-and-space pattern. The SEM photograph of this photo resist is shown in FIG. 4.

What is claimed is:

1. A reaction development patterning process comprising the steps of irradiating a photo resist layer masked by a desired pattern using ultraviolet light and subsequently washing said layer using a solvent solution containing a nucleophilic amine wherein said photo resist layer comprises (a) a condensation type polymer containing one or more carbonate, ester, urethane or amide bonds in the main chain but which is substantially devoid of imido groups and (b) a photo acid generating agent, wherein said photo acid generating agent is (c) a quinone diazide compound or (d) a mixture of an onium salt and an ester of an organic acid.

2. The reaction development patterning process as in claim 1, wherein said condensation type polymer does not contain functional groups capable of reacting with a base or reactive groups capable of generating carboxyl groups or phenolic hydroxyl groups upon reacting with an acid or a base.

3. The reaction development patterning process as in claim 1, wherein said solvent solution containing a nucleophilic amine is a mixture of said nucleophilic amine and at least one of water and an organic solvent.

4. The reaction development patterning process as in claim 3 wherein said nucleophilic amine is an inorganic amine.

5. The reaction development patterning process as in claim 4, wherein said inorganic amine is hydroxylamine, hydrazine or ammonia.

6. A formed material formed by the reaction development patterning process of claim 1.

7. A semiconductor integrated circuit, printed wire substrate, liquid crystal panel or optical wave guide device containing the formed material as in claim 6.

8. The reaction development patterning process as in claim 1, wherein said photo acid generating agent is an ester compound of 1,2-naphthoquinone-2-diazide-5-sulfonic acid and said solvent solution containing a nucleophilic amine does not contain a base containing OH$^-$ ion.

9. The reaction development patterning process as in claim 8, wherein said photo acid generating agent is an ester compound of 1,2-naphthoquinone-2-diazide-5-sulfonic acid and said solvent solution containing a nucleophilic amine does not contain tetramethylammonium hydroxide (TMAH).

* * * * *